US008710935B2

(12) United States Patent
Schober et al.

(10) Patent No.: US 8,710,935 B2

(45) Date of Patent: Apr. 29, 2014

(54) HERMETICALLY SEALED ATOMIC SENSOR PACKAGE MANUFACTURED WITH EXPENDABLE SUPPORT STRUCTURE

(71) Applicant: Honeywell International Inc., Morristown, NJ (US)

(72) Inventors: Christina Marie Schober, St. Anthony, MN (US); Terry Dean Stark, St. Louis Park, MN (US); Delmer L. Smith, Edina, MN (US); James A. Vescera, Hopkins, MN (US)

(73) Assignee: Honeywell International Inc., Morristown, NJ (US)

( * ) Notice: Subject to any disclaimer, the term of this patent is extended or adjusted under 35 U.S.C. 154(b) by 74 days.

(21) Appl. No.: 13/625,512

(22) Filed: Sep. 24, 2012

(65) Prior Publication Data

US 2014/0085014 A1 Mar. 27, 2014

(51) Int. Cl.
*H03B 17/00* (2006.01)

(52) U.S. Cl.
USPC .......................................... 331/94.1; 331/68

(58) Field of Classification Search
USPC .......................................... 331/94.1, 68
See application file for complete search history.

(56) References Cited

U.S. PATENT DOCUMENTS

| | | | | |
|---|---|---|---|---|
| 6,265,945 | B1 | 7/2001 | Delaney et al. | |
| 6,570,459 | B1 | 5/2003 | Nathanson et al. | |
| 7,400,207 | B2 | 7/2008 | Lipp et al. | |
| 7,619,485 | B2 | 11/2009 | DeNatale et al. | |
| 7,701,302 | B2 | 4/2010 | Koyama | |
| 7,931,794 | B2 | 4/2011 | Happer et al. | |
| 7,944,317 | B2 | 5/2011 | Strabley | |
| 7,965,147 | B2 | 6/2011 | Strabley et al. | |
| 8,005,332 | B2 | 8/2011 | Schmidt et al. | |
| 8,526,000 | B1 * | 9/2013 | Schober et al. | 356/437 |
| 2010/0033255 | A1 | 2/2010 | Strabley | |
| 2010/0111750 | A1 | 5/2010 | Touchberry et al. | |

OTHER PUBLICATIONS

Hulbert et al., “Sealing Techniques for On-Chip Atomic Vapor Cells”, “Advances in Slow and Fast Light”, 2008, pp. 1-9.
Raffray et al., “A Self-Cooled Liquid Breeder Blanket for a Laser IFE Power Plant with Magnetic Intervention”, “Fusion Science and Technology”, Oct. 2007, pp. 603-608, vol. 52.

* cited by examiner

*Primary Examiner* — Joseph Chang
(74) *Attorney, Agent, or Firm* — Fogg & Powers LLC

(57) ABSTRACT

A method of forming a physics package for an atomic sensor comprises providing an expendable support structure having a three-dimensional configuration, providing a plurality of optical panels, and assembling the optical panels on the expendable support structure such that edges of adjacent panels are aligned with each other. The edges of adjacent panels are sealed together to form a physics block having a multi-faced geometric configuration. The expendable support structure is then removed while leaving the physics block intact.

20 Claims, 5 Drawing Sheets

HERMETICALLY SEALED ATOMIC SENSOR PACKAGE MANUFACTURED WITH EXPENDABLE SUPPORT STRUCTURE

STATEMENT REGARDING FEDERALLY SPONSORED RESEARCH OR DEVELOPMENT

This invention was made with Government support under contract No. W31P4Q-09-C-0348 awarded by the U.S. Army. The Government has certain rights in the invention.

BACKGROUND

Primary time standards such as atomic clocks have traditionally been relatively large table top devices. For example, a physics package of a conventional atomic clock tends to be large and requires an expensive support system. Thus, efforts are under way to reduce the size of primary time standards such as by reducing the physics package of atomic clocks and other sensors which utilize cold atom clouds as the sensing element.

Making the physics package smaller has unique and complex challenges since the physics package requires multiple windows, minors, and a hermetic seal of non-magnetic materials. In conventional methods of manufacturing a physics package, a glass body is machined with multiple holes for placement of minors and windows on its exterior, and a plurality of angled borings that serve as light paths to trap, cool, and manipulate the cold atomic sample. A cavity evacuation structure or pumping port is attached to provide for initial vacuum evacuation of the physics package. The machining must leave enough internal structure to support building the physics package.

In general, an atomic clock operates by interrogating atoms with light beams from one or more lasers. The physics package defines a vacuum sealed chamber that holds the atoms that are interrogated. The atoms within the physics package are trapped within the volume such that the plurality of light paths intersect with the atoms from different angles.

Developing a small volume physics package which allows for large optical beams and added-flexibility of a multi-beam configuration is important to the development of high performance miniature atomic physics packages. However, smaller size requirements for atomic clocks is challenging current building techniques. The size reduction of atomic clocks affects their performance as the mirrors and windows shrink. Furthermore, the internal volume reduction adversely affects performance of the atomic clocks.

SUMMARY

A method of forming a physics package for an atomic sensor comprises providing an expendable support structure having a three-dimensional configuration, providing a plurality of optical panels, and assembling the optical panels on the expendable support structure such that edges of adjacent panels are aligned with each other. The edges of adjacent panels are sealed together to form a physics block having a multi-faced geometric configuration. The expendable support structure is then removed while leaving the physics block intact.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
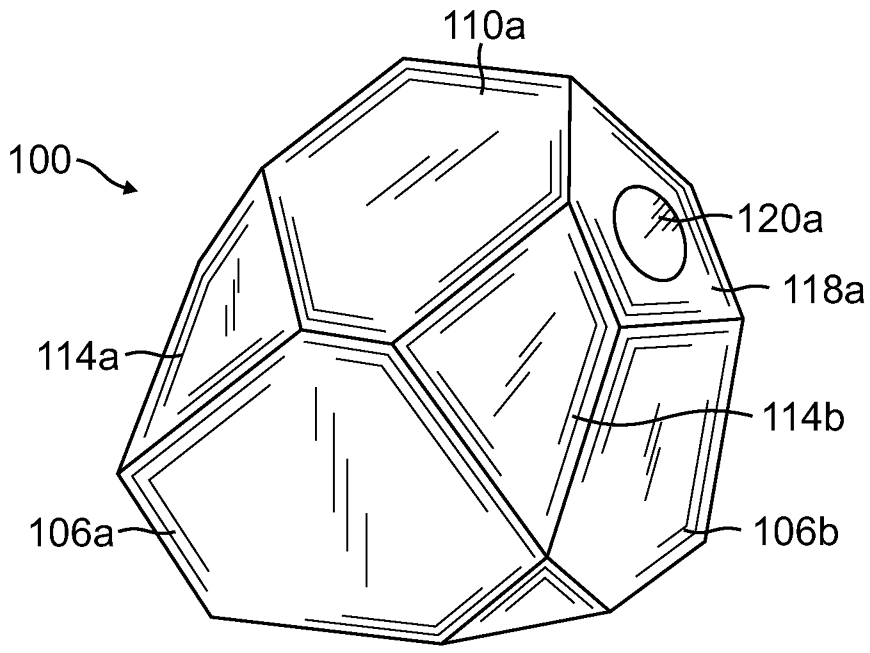
FIG. 1 illustrates a physics block for a physics package of an atomic sensor according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A method for manufacturing a hermetically sealed physics package for an atomic sensor such as atomic clock is provided. In general, a plurality of panels for the physics package is assembled on an expendable support structure, such as a sacrificial internal or external support structure, which is then removed after hermetically sealing the assembled package.

In one technique for constructing the physics package, an expendable central core is formed in the three-dimensional shape of an internal cavity used as a vacuum chamber of the physics package. A plurality of panels is assembled around the expendable central core such that the edges of adjacent panels are aligned with each other at various seams, and the edges of the adjacent panels are then sealed together at the seams. The expendable central core is then dissolved with a chemical and removed from the physics package.

In other exemplary techniques, the panels for the physics package are assembled using an internal or external sacrificial skeletal framework. The skeletal framework is then removed from the assembled panels. For example, the framework can be contacted with a chemical that dissolves or melts the framework for removal from the physics package, or an ion etch can be used to remove the framework.

The present method allows a physics package to be built without a permanent internal or external support structure. This allows substantially all of the surface area of the panels to be used as windows or mirrors in the physics package, thereby improving the performance of the atomic sensor.

FIGS. 1 and 2A-2F illustrate a physics block 100 for a physics package of an atomic sensor according to one embodiment that can be constructed according to the present technique. The physics block 100 includes a plurality of panels, including windows and minors, which have various polygonal shapes that are assembled into a three-dimensional structure that is configured to enclose an internal vacuum chamber for the physics package. The adjacent panels are oriented at an angle with respect to one another and form adjacent faces of the physics package. The placement and orientation of the panels is configured to provide the desired light paths within the vacuum chamber. In one example, the panels are generally planar structures having flat interior and exterior surfaces. In other examples, one or more of the panels can have other geometries (e.g., concave or convex).

In particular, physics block 100 includes a plurality of main window panels 106*a*, 106*b*, 106*c*, and 106*d*, which are depicted variously in FIGS. 1, 2B, 2C, 2D, and 2F. The main window panels are configured to allow laser light to enter the vacuum chamber during operation of the atomic sensor. The window panels of physics block 100 can be composed of an optically transparent material such as a glass, an optical glass (e.g., BK-7 or Zerodur®), or other transparent material such as sapphire.

Figure 2A:
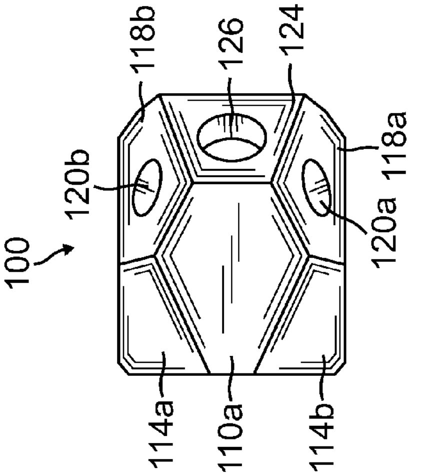
FIG. 2A is a top view of the physics block of FIG. 1.
Figure 2B:
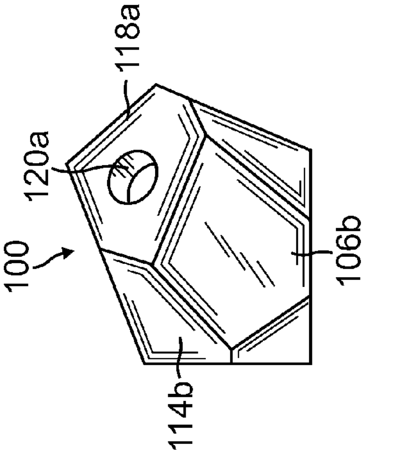
FIG. 2B is a side view of the physics block of FIG. 1.
Figure 2C:
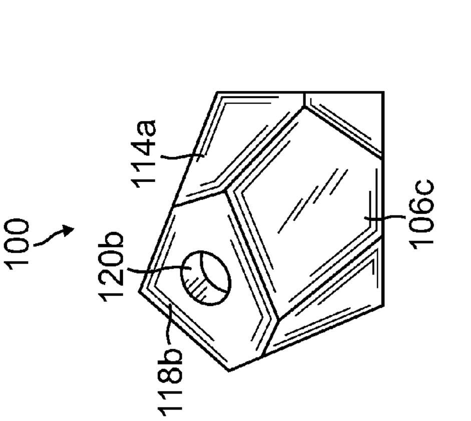
FIG. 2C is an opposing side view of the physics block of FIG. 1.
Figure 2D:
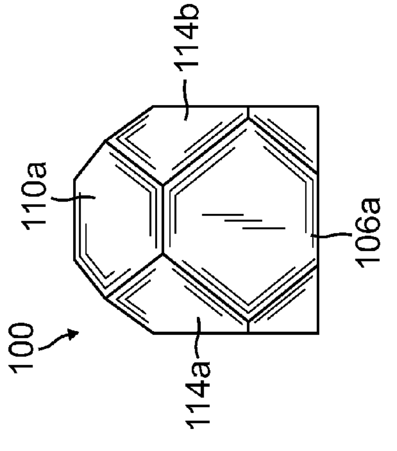
FIG. 2D is a front view of the physics block of FIG. 1.
Figure 2E:
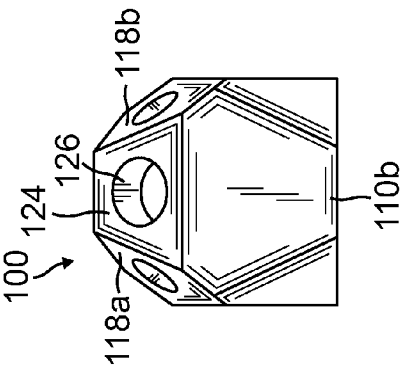
FIG. 2E is a back view of the physics block of FIG. 1.
Figure 2F:
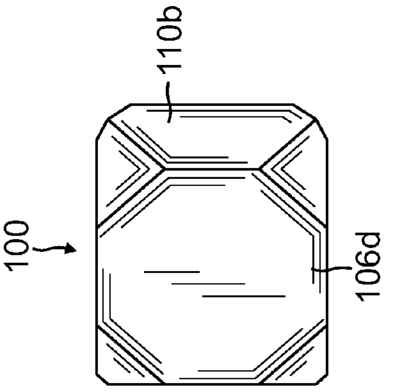
FIG. 2F is a bottom view of the physics block of FIG. 1
Figure 3A:
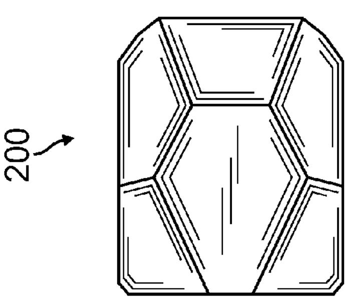
FIGS. 3A-3F illustrate various views of an expendable core used to assemble the physics block of FIG. 1 according to one approach.
Figure 3B:
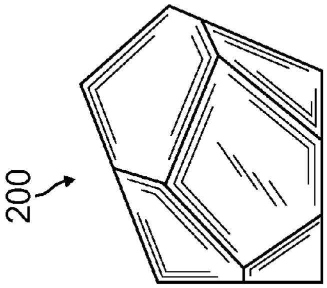
Figure 3C:
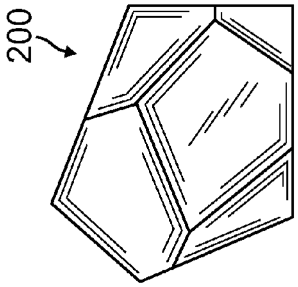
Figure 3D:
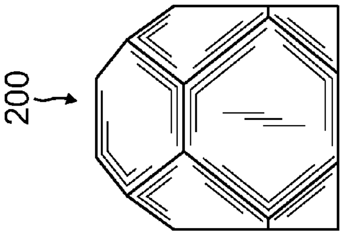
Figure 3E:
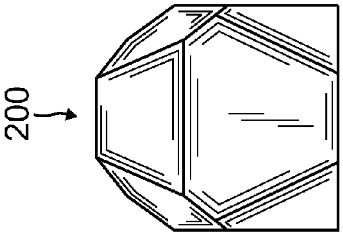
Figure 3F:
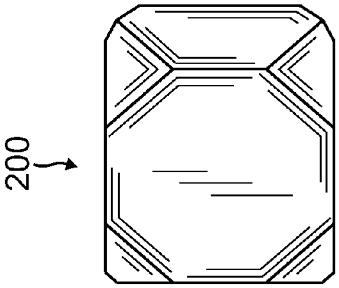

The physics block 100 also includes a first oblong mirror panel 110*a* as shown in FIGS. 1, 2A and 2D, and a second oblong minor panel 110*b* as shown in FIGS. 2E and 2F. The minor panels 110*a* and 110*b* have internal reflective surfaces that are configured reflect and direct the laser light within the vacuum chamber during operation of the atomic sensor. The minor panels can be composed of a non-optically transparent material that is optically reflective or has an optically reflective coating thereon. Alternatively, the minor panels can be composed of an optical glass (e.g., BK-7 or Zerodur®), or other transparent material such as sapphire, with an optically reflective coating thereon. In examples using a reflective coating, the reflective coating can include a single or multilayer metal or dielectric stack coating, or combinations thereof. In addition, individual coatings can be applied to individual panels. The reflective surfaces of the minor panels can be planar or curved to slightly focus a beam of light as necessary.

The physics block 100 further includes a first photodetector window panel 114*a* as shown in FIGS. 1, 2A, 2C, and 2D, and a second photodetector window panel 114*b* as shown in FIGS. 1, 2A, 2B, and 2D. The photodetector window panels 114*a* and 114*b* provide optical communication between the light in the vacuum chamber and respective photodetectors of the atomic sensor.

The physics block 100 can also optionally include a first fill tube panel 118*a* as depicted in FIGS. 1, 2A, 2B, and 2E, and a second fill tube panel 118*b* as depicted in FIGS. 2A, 2C, and 2E. The fill tube panels 118*a* and 118*b* include respective holes 120*a* and 120*b*, which can be used to provide fluid communication between fill tubes and the vacuum chamber.

The physics block 100 can optionally include a getter cup panel 124 as shown in FIGS. 2A and 2E, which has a hole 126 therein. The hole 126 is configured to hold a cup with getter material for removing contaminants from the internal vacuum chamber and to limit the partial pressures of some gasses.

In order to assemble physics block 100 according to one approach, a sacrificial expendable core is made in the shape of the internal vacuum chamber of physics block 100.

Accordingly, the expendable core has the same configuration and surfaces as shown for physics block 100. An exemplary expendable core 200 is depicted in FIGS. 3A-3F, which corresponds to the same views of physics block 100 shown in FIGS. 2A-2F. The expendable core 200 has a three-dimensional shape corresponding to the shape and size of the internal vacuum chamber of physics block 100. Accordingly, each of the outer surfaces of core 200 has a polygonal shape corresponding to the polygonal shape of one of the panels of physics block 100.

The expendable core may be cast or machined into a desired shape of the physics block from various materials, such as sand, clay, salts, or combinations thereof. Exemplary materials for the expendable core include sand/clay combinations that dissolve with a solvent such as water, salt forms that dissolve with water, or other materials that survive frit temperatures but can be dissolved for removal afterwards. For example, sand cast forms can be made as composites with other materials to hold the formed shape such as with gum arabic and/or kaolin clay. In addition, the expendable core may be formed of other materials such as gallium, or aerogels such as carbon-based aerogels.

The panels of the physics block are assembled around the expendable core so that each panel is over the outer surface of the core the corresponding polygonal shape. The areas where the panels meet can be recessed so that a sealing material used to seal the panels together does not bond to the core. For example, the edges of the panels may be cut back to allow frit to flow without touching the core material. In addition, the core surfaces may have recessed central areas so that the window and mirror areas of the panels do not touch the core but are still supported at their panel edges.

External fixtures can be positioned to hold the panels against the expendable core during assembly until the edges of the panels are sealed together. For example, individual pegs or standoffs can be inserted into the core for alignment of the panel surfaces. The various panels are sealed together at their abutting edges using a frit material, brazing, a sol-gel material, or other suitable attachment mechanism. When using a frit material, the entire assembly, including fixtures, glass panels fritted together, and core is run through a frit furnace to seal the glass panel seams.

After sealing of the panels is accomplished, a chemical solvent that dissolves the core structure without damaging the panels is applied to the core, and the resulting core material slurry is removed. In an exemplary embodiment, a fill tube hole in one of the panels may be used to add the chemical solution and remove the dissolved core material. Any pegs or standoffs from fixturing can be removed through the fill tube port with the dissolved core material. In order to protect the surfaces of the mirrors and windows during build from damage, a protective coating such as chrome may be applied to the minor and window surfaces and later removed from the sealed physics block.

Figure 4A:
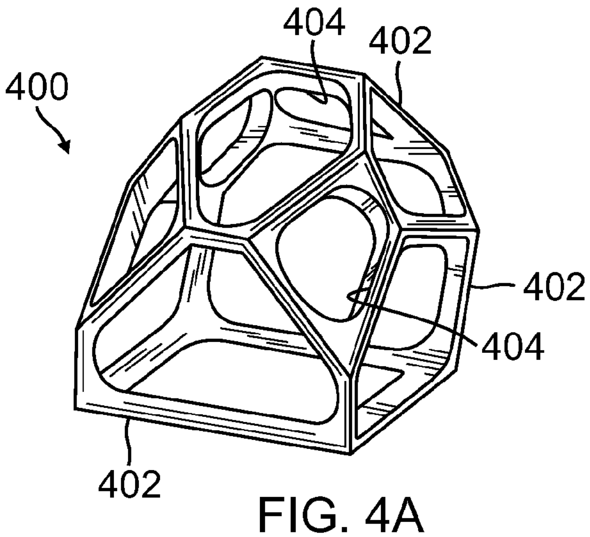
FIGS. 4A-4D illustrate a method of assembling a physics block for a physics package of an atomic sensor according to another approach.

In another exemplary technique for constructing a physics package, the panels of a physics block for the physics package are assembled using an internal or external sacrificial skeletal framework, such as with an expendable framework 400 shown in FIG. 4A. The framework 400 has a three-dimensional shape with a multi-faced geometry, which corresponds to the shape and size of the internal or external surfaces of the physics block. The framework 400 includes a plurality of interconnected support members 402 extending between one another in a three-dimensional structure. The support members 402 are interconnected and dimensioned to provide a skeletal structure for attaching the panels onto outer surfaces or inner surfaces of support members 402. Accordingly, the interconnected support members 402 define a plurality of open frame structures 404 having various polygonal shapes corresponding to the panels of the physics block.

In one embodiment, framework 400 is a monolithic structure formed of an expendable material. That is, all of the support members 402 are formed together as a single integral structure. In another embodiment, framework 400 is formed of multiple support members 402 that are connected together. The support framework 400 can be composed of an expendable, sacrificial material such as sand, clay, salts, gallium, aerogels, or combinations thereof. Other suitable materials for framework 400 include aluminum, copper, manganese, molybdenum, nickel, vanadium, and the like.

Figure 4B:
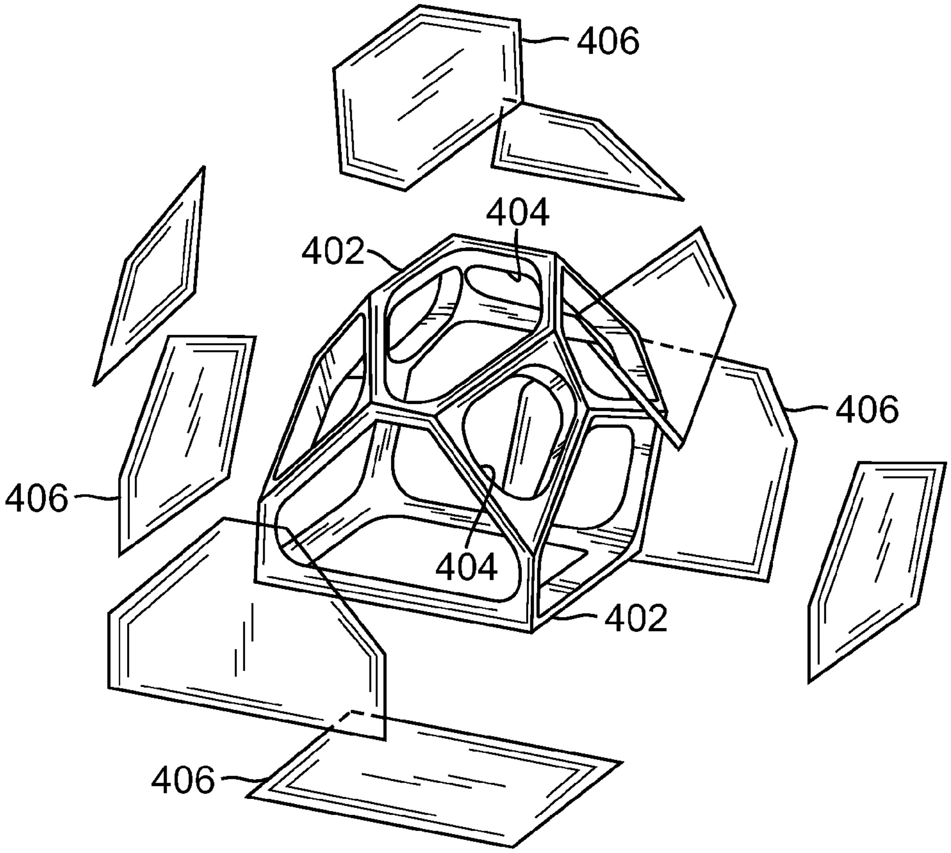

As illustrated in FIG. 4B, a plurality of panels such as optical panels 406 are provided, with one or more of panels 406 having the same polygonal shape as one or more of the open frame structures 404 defined by support members 402. The optical panels 406 are aligned with a corresponding frame structure 404. In one example, optical panels 406 are generally planar structures having flat interior and exterior surfaces. In other examples, one or more of the panels can have other geometries (e.g., concave or convex). The panels include both optically transmissive panels and optically reflective panels, which form various windows and mirrors for the physics package.

Figure 4C:
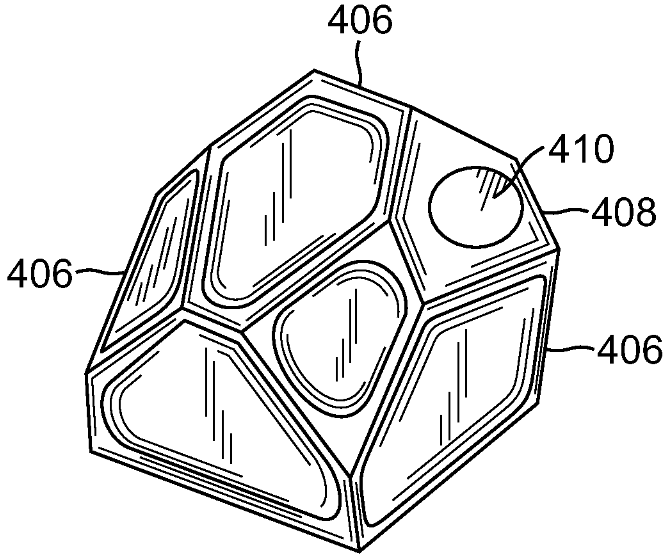

The optical panels 406 are assembled around framework 400, such as shown in FIG. 4C, such that each of the panels cover one of the open frame structures with a corresponding polygonal shape. The edges of optical panels 406 are aligned and sealed together such as with a frit material, sol-gel material, or the like. In one embodiment, at least one panel can be provided with a fill tube aperture formed therethrough, either before or after assembly around framework 400. For example, a panel 408 can have a fill tube hole 410, as shown in FIG. 4C.

Once panels 406 are assembled and sealed, framework 400 is removed without damaging the panels. For example, when framework 400 is composed of gallium, framework 400 can be melted by water heated to a temperature of about 29.8° C. The heated water can be poured into fill tube hole 410, and the melted gallium and water can be poured out of hole 410. When framework 400 is composed of sand, clay, salts, or aerogels, framework 400 can be removed by dissolving it with a solvent. When framework 400 is formed from other metal materials, such as aluminum, copper, manganese, molybdenum, nickel, or vanadium, framework 400 can be removed by ion etch without damaging the optical panels.

Figure 4D:
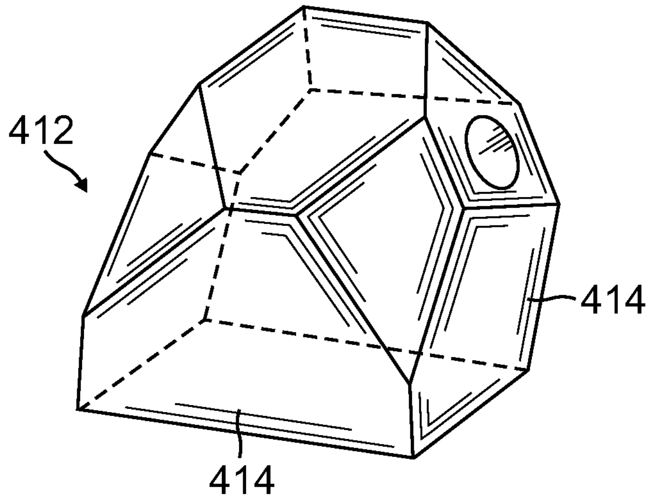

Once the framework is removed, an assembled physics block 412 is left without any support structure, as shown in FIG. 4D. The resulting physics block 412 has a multifaced geometry that includes a plurality of substantially planar faces 414 oriented at different angles about the exterior thereof.

In an alternative approach, the optical panels are assembled against the inner surfaces of support members 402 such that framework 400 acts as a temporary exoskeleton. The edges of the panels are then sealed together such as with a frit or sol-gel material. The framework 400 around the optical panels is them removed without damaging the panels. This leaves an assembled physics block without any support structure, such as physics block 412 shown in FIG. 4D.

Depending on the temperature needed to cure the material joining the panels together, the expendable core or skeleton material can be selected appropriately. For example gallium is limited to applications where the panels are joined together with a vacuum seal material that cures at less than the melting temperature of the gallium. Thus, if a room temperature cure glass bond is used, such as a sodium silicate sol-gel, then gallium can be used as the expendable material for an internal core or skeletal framework. As the curing does not go over the gallium melt point, the gallium is removed after cure by heating over the melt point. The resulting structure glass bond material can then be heat strengthened after the gallium is removed.

In other embodiments, panels without a fill tube hole can be used to assemble the block for the physics package. For example, a thermal glass seal can be used in which the sealing takes place in a vacuum. Another option is to thermally seal off a short glass tube when the tube is surrounded by air. Alternatively, a final glass panel can be added in place inside a vacuum vessel with a controlled (or vacuum) atmosphere inside. By attaining low enough pressure prior to sealing, the reduction in temperature will drop the pressure further, and the bake will help clean the assembly. Capsules or vials sealed to the main device can hold Rb, allowing charging, and even recharging of the physics package. Ultrasonic or sonic vibrations can be used to fracture select vials into the physics package.

Example Embodiments

Example 1 includes a method of forming a physics package for an atomic sensor, the method comprising providing an expendable support structure having a three-dimensional configuration; providing a plurality of optical panels; assembling the optical panels on the expendable support structure such that edges of adjacent panels are aligned with each other; sealing the edges of adjacent panels together to form a physics block having a multifaced geometric configuration; and removing the expendable support structure while leaving the physics block intact.

Example 2 includes the method of Example 1, wherein the expendable support structure is an internal core over which the optical panels are assembled.

Example 3 includes the method of Example 1, wherein the expendable support structure is a skeletal framework on which the optical panels are assembled.

Example 4 includes the method of any of Examples 1-3, wherein the expendable support structure is formed of a material that dissolves in a solvent.

Example 5 includes the method of any of Examples 1-3, wherein the expendable support structure is formed of a material comprising sand, clay, salts, aerogel, or combinations thereof.

Example 6 includes the method of any of Examples 1-3, wherein the expendable support structure is formed of a material comprising gallium.

Example 7 includes the method of Example 6, wherein the edges of adjacent panels are sealed together with a sol-gel material.

Example 8 includes the method of Examples 1 and 3, wherein the expendable support structure comprises aluminum, copper, manganese, molybdenum, nickel, vanadium, or combinations thereof.

Example 9 includes the method of Example 8, wherein the expendable support structure is removed with an ion etch.

Example 10 includes the method of any of Examples 1-9, wherein the optical panels comprise windows and mirrors.

Example 11 includes a physics package formed by any of the methods of Examples 1-10.

Example 12 includes a method of manufacturing a physics package for an atomic sensor, the method comprising forming an expendable core having a three-dimensional configuration corresponding to a contour of an internal chamber of the physics package, the expendable core including a plurality of outer surfaces with different polygonal shapes; providing a plurality of optical panels, each of the optical panels having a polygonal shape that corresponds to the polygonal shape of at least one of the outer surfaces of the core structure; assembling the optical panels around the core structure so that each panel is over the outer surface of the core structure with a corresponding polygonal shape, each of the panels having a plurality of edges that are aligned with other edges of adjacent panels; sealing the edges of the adjacent panels together around the core structure such that the panels are in a multifaced geometric configuration; contacting a chemical liquid with the core structure such that the core structure dissolves into a slurry of core material; and removing the slurry of core material.

Example 13 includes the method of Example 12, wherein the expendable core is formed of a material comprising sand, clay, salts, aerogel, gallium, or combinations thereof.

Example 14 includes the method of Examples 12 or 13, wherein the physics package is configured for an atomic clock.

Example 15 includes a method of manufacturing a physics package for an atomic sensor, the method comprising forming an expendable framework having a three-dimensional structure corresponding to a contour of an internal chamber of the physics package, the expendable framework including a plurality of interconnected support members defining a plurality of open frame structures; providing a plurality of optical panels, each of the optical panels having a polygonal shape that corresponds to the polygonal shape of at least one of the open frame structures; assembling the optical panels on the expendable framework such that each of the panels covers one of the open frame structures with a corresponding polygonal shape, each of the panels having a plurality of edges that are aligned with other edges of adjacent panels; sealing the edges of the adjacent panels together such that the panels are in a multifaced geometric configuration; and removing the expendable framework from the assembled panels.

Example 16 includes the method of Example 15, wherein the expendable framework forms an internal skeletal frame on which the optical panels are assembled.

Example 17 includes the method of Example 15, wherein the expendable framework forms an external skeletal frame on which the optical panels are assembled.

Example 18 includes the method of any of Examples 15-17, wherein the expendable framework comprises sand, clay, salts, aerogel, gallium, or combinations thereof.

Example 19 includes the method of any of Examples 15-17, wherein the expendable framework comprises aluminum, copper, manganese, molybdenum, nickel, vanadium, or combinations thereof.

Example 20 includes the method of any of Examples 15-19, wherein the physics package is configured for an atomic clock.

The present invention may be embodied in other forms without departing from its essential characteristics. The described embodiments are to be considered in all respects only as illustrative and not restrictive. Therefore, it is intended that this invention be limited only by the claims and the equivalents thereof.

What is claimed is:

1. A method of forming a physics package for an atomic sensor, the method comprising:

providing an expendable support structure having a three-dimensional configuration;

providing a plurality of optical panels;

assembling the optical panels on the expendable support structure such that edges of adjacent panels are aligned with each other;

sealing the edges of adjacent panels together to form a physics block having a multifaced geometric configuration; and removing the expendable support structure while leaving the physics block intact.

2. The method of claim 1, wherein the expendable support structure is an internal core over which the optical panels are assembled.

3. The method of claim 1, wherein the expendable support structure is a skeletal framework on which the optical panels are assembled.

4. The method of claim 1, wherein the expendable support structure is formed of a material that dissolves in a solvent.

5. The method of claim 1, wherein the expendable support structure is formed of a material comprising sand, clay, salts, aerogel, or combinations thereof.

6. The method of claim 1, wherein the expendable support structure is formed of a material comprising gallium.

7. The method of claim 6, wherein the edges of adjacent panels are sealed together with a sol-gel material.

8. The method of claim 3, wherein the expendable support structure comprises aluminum, copper, manganese, molybdenum, nickel, vanadium, or combinations thereof.

9. The method of claim 8, wherein the expendable support structure is removed with an ion etch.

10. The method of claim 1, wherein the optical panels comprise windows and minors.

11. A physics package formed by the method of claim 1.

12. A method of manufacturing a physics package for an atomic sensor, the method comprising:

forming an expendable core having a three-dimensional configuration corresponding to a contour of an internal chamber of the physics package, the expendable core including a plurality of outer surfaces with different polygonal shapes;

providing a plurality of optical panels, each of the optical panels having a polygonal shape that corresponds to the polygonal shape of at least one of the outer surfaces of the core structure;

assembling the optical panels around the core structure so that each panel is over the outer surface of the core structure with a corresponding polygonal shape, each of the panels having a plurality of edges that are aligned with other edges of adjacent panels;

sealing the edges of the adjacent panels together around the core structure such that the panels are in a multifaced geometric configuration;

contacting a chemical liquid with the core structure such that the core structure dissolves into a slurry of core material; and removing the slurry of core material.

13. The method of claim 12, wherein the expendable core is formed of a material comprising sand, clay, salts, aerogel, gallium, or combinations thereof.

14. The method of claim 12, wherein the physics package is configured for an atomic clock.

15. A method of manufacturing a physics package for an atomic sensor, the method comprising:

forming an expendable framework having a three-dimensional structure corresponding to a contour of an internal chamber of the physics package, the expendable framework including a plurality of interconnected support members defining a plurality of open frame structures;

providing a plurality of optical panels, each of the optical panels having a polygonal shape that corresponds to the polygonal shape of at least one of the open frame structures;

assembling the optical panels on the expendable framework such that each of the panels covers one of the open frame structures with a corresponding polygonal shape, each of the panels having a plurality of edges that are aligned with other edges of adjacent panels;

sealing the edges of the adjacent panels together such that the panels are in a multifaced geometric configuration; and removing the expendable framework from the assembled panels.

16. The method of claim 15, wherein the expendable framework forms an internal skeletal frame on which the optical panels are assembled.

17. The method of claim 15, wherein the expendable framework forms an external skeletal frame on which the optical panels are assembled.

18. The method of claim 15, wherein the expendable framework comprises sand, clay, salts, aerogel, gallium, or combinations thereof.

19. The method of claim 15, wherein the expendable framework comprises aluminum, copper, manganese, molybdenum, nickel, vanadium, or combinations thereof.

20. The method of claim 15, wherein the physics package is configured for an atomic clock.

* * * * *